(12) United States Patent
Engle

(10) Patent No.: US 9,913,015 B2
(45) Date of Patent: Mar. 6, 2018

(54) ENCLOSURE DEVICE FOR A VIDEO DISPLAY

(71) Applicant: Rain Case, LLC, Pontiac, MI (US)

(72) Inventor: Joseph Orion Engle, Waterford, MI (US)

(73) Assignee: RAIN CASE, LLC, Pontiac, MI (US)

( * ) Notice: Subject to any disclaimer, the term of this patent is extended or adjusted under 35 U.S.C. 154(b) by 572 days.

(21) Appl. No.: 14/310,267

(22) Filed: Jun. 20, 2014

(65) Prior Publication Data

US 2014/0376757 A1 Dec. 25, 2014

Related U.S. Application Data

(63) Continuation of application No. PCT/US2014/043326, filed on Jun. 20, 2014.
(Continued)

(51) Int. Cl.
*H04N 5/64* (2006.01)
*H04R 1/02* (2006.01)
(Continued)

(52) U.S. Cl.
CPC ............ *H04R 1/028* (2013.01); *G06F 1/16* (2013.01); *H04N 5/64* (2013.01); *H05K 7/00* (2013.01); *H04N 1/00562* (2013.01); *H04R 1/023* (2013.01); *H04R 2499/15* (2013.01); *H05K 5/061* (2013.01); *Y10S 248/918* (2013.01)

(58) Field of Classification Search
CPC .. H05K 5/0004; H05K 5/0008; H05K 5/0017; H05K 5/0204; H05K 5/0208; H05K 5/0213; H05K 5/0217; H05K 5/0221; H05K 5/0239; H05K 5/03; H05K 5/06; H05K 5/061; H05K 5/069; H05K 7/14; H05K 7/20954; H04N 5/64; H04N 1/00909; H04N 1/00562; H04N 1/005
See application file for complete search history.

(56) References Cited

U.S. PATENT DOCUMENTS 3,418,426 A 12/1968 Schlegel et al.
5,033,802 A 7/1991 Fairbanks
(Continued)

OTHER PUBLICATIONS

Installation Instructions, DGC Series Series Display Guard Enclosures DGC32, DGC42, DGC-50 and DGC-65, Chief Manufacturing, Jun. 2008.*
(Continued)

*Primary Examiner* — Duc Nguyen
*Assistant Examiner* — Kile Blair
(74) *Attorney, Agent, or Firm* — The Dobrusin Law Firm, P.C.

(57) ABSTRACT

An improved enclosure device for protecting electronic equipment is disclosed. The enclosure device may include an adapter plate for attaching the electronic equipment to the enclosure device. The adapter plate is preferably configured to prevent damage to the electronic equipment when mounting the enclosure device to a generally vertical support. The enclosure device may include one or more inserts having an opening and a slit for receiving a cable so that the cable can be passed through the enclosure device. The insert preferably seals against the cable so that a barrier to water is created. As such, the electronic equipment may be protected from rain.

25 Claims, 10 Drawing Sheets

Related U.S. Application Data

(60) Provisional application No. 61/837,214, filed on Jun. 20, 2013.

(51) Int. Cl.
   *H05K 7/00* (2006.01)
   *G06F 1/16* (2006.01)
   *H05K 5/06* (2006.01)
   *H04N 1/00* (2006.01)

(56) References Cited

U.S. PATENT DOCUMENTS

| | | | |
|---|---|---|---|
| 5,071,203 A | 12/1991 | Boyd | |
| 5,675,124 A * | 10/1997 | Stough | H02G 15/013 174/656 |
| D397,336 S | 8/1998 | Woodworth | |
| 6,298,906 B1 * | 10/2001 | Vize | B60K 11/04 165/122 |
| 6,377,320 B1 | 4/2002 | Ananian et al. | |
| 6,536,855 B2 | 5/2003 | Maruta | |
| 6,708,797 B2 | 3/2004 | Long et al. | |
| 6,709,078 B2 | 3/2004 | Johnson | |
| 6,802,575 B1 | 10/2004 | Lee | |
| 6,822,857 B2 * | 11/2004 | Jung | F16M 11/10 248/920 |
| 6,845,775 B1 * | 1/2005 | Barthes | A61B 46/10 128/849 |
| D532,413 S | 11/2006 | Goldstein | |
| 7,175,152 B2 | 2/2007 | Dittmer | |
| 7,312,836 B2 | 12/2007 | Maxson | |
| 7,388,956 B2 | 6/2008 | Johnson et al. | |
| 7,812,891 B2 | 10/2010 | Maruta | |
| D627,317 S | 11/2010 | Gretz | |
| D641,721 S | 7/2011 | Moscovitch et al. | |
| 8,102,483 B2 | 1/2012 | Perry et al. | |
| 8,109,580 B1 | 2/2012 | Didier et al. | |
| D664,129 S | 7/2012 | Mora | |
| D669,075 S | 10/2012 | Seo | |
| 8,310,824 B2 * | 11/2012 | Dunn | H04N 5/64 312/223.1 |
| 8,350,984 B2 | 1/2013 | Perry et al. | |
| 2003/0034716 A1 | 2/2003 | Ramesh | |
| 2008/0089548 A1 | 4/2008 | Huang | |
| 2008/0094786 A1 | 4/2008 | Liou et al. | |
| 2008/0123014 A1 | 5/2008 | Lin | |
| 2009/0231807 A1 | 9/2009 | Bouissiere | |
| 2009/0231808 A1 | 9/2009 | Burgner | |
| 2010/0136282 A1 | 6/2010 | Moss | |
| 2010/0171889 A1 | 7/2010 | Pantel et al. | |
| 2010/0201905 A1 | 8/2010 | Ishii | |
| 2010/0315777 A1 | 12/2010 | Dreher | |
| 2012/0194750 A1 | 8/2012 | Carr | |
| 2012/0194971 A1 | 8/2012 | Marker | |
| 2013/0192866 A1 | 8/2013 | King | |

OTHER PUBLICATIONS

International Search Report and Written Opinion, Application No. PCT/US2014/043326, dated Apr. 2, 2015.

* cited by examiner

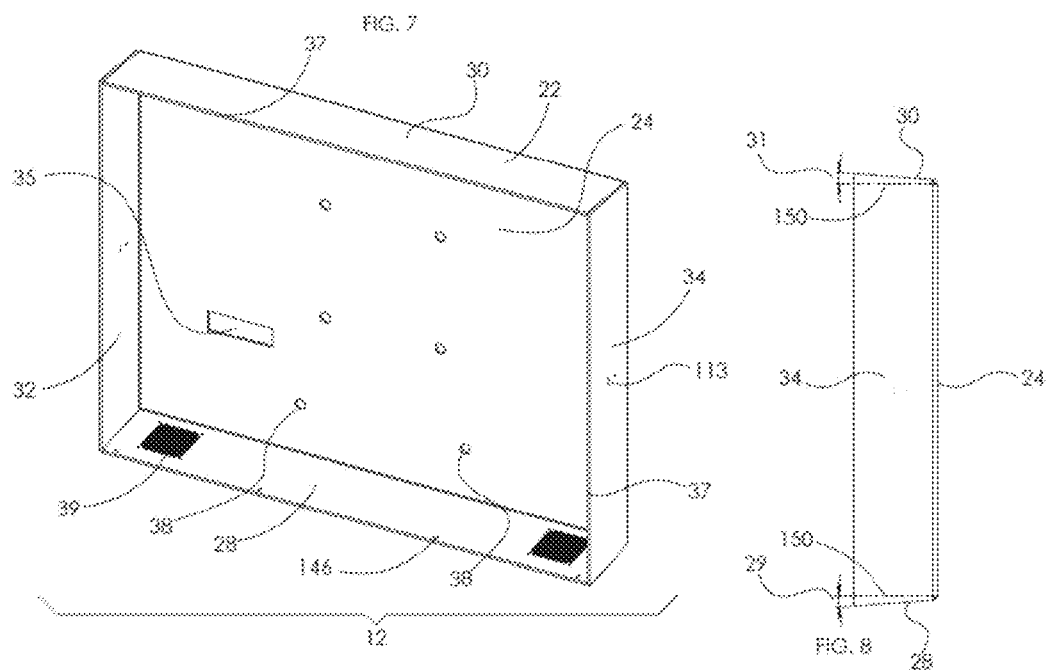
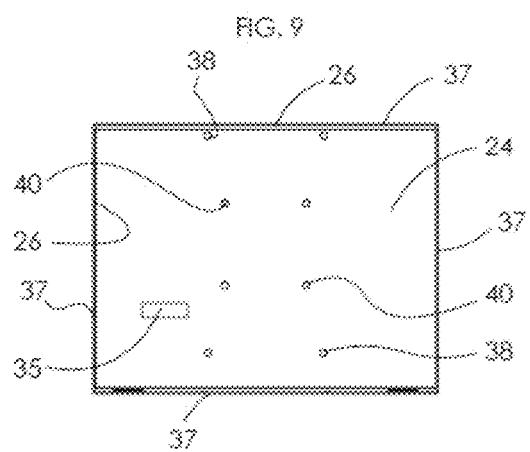

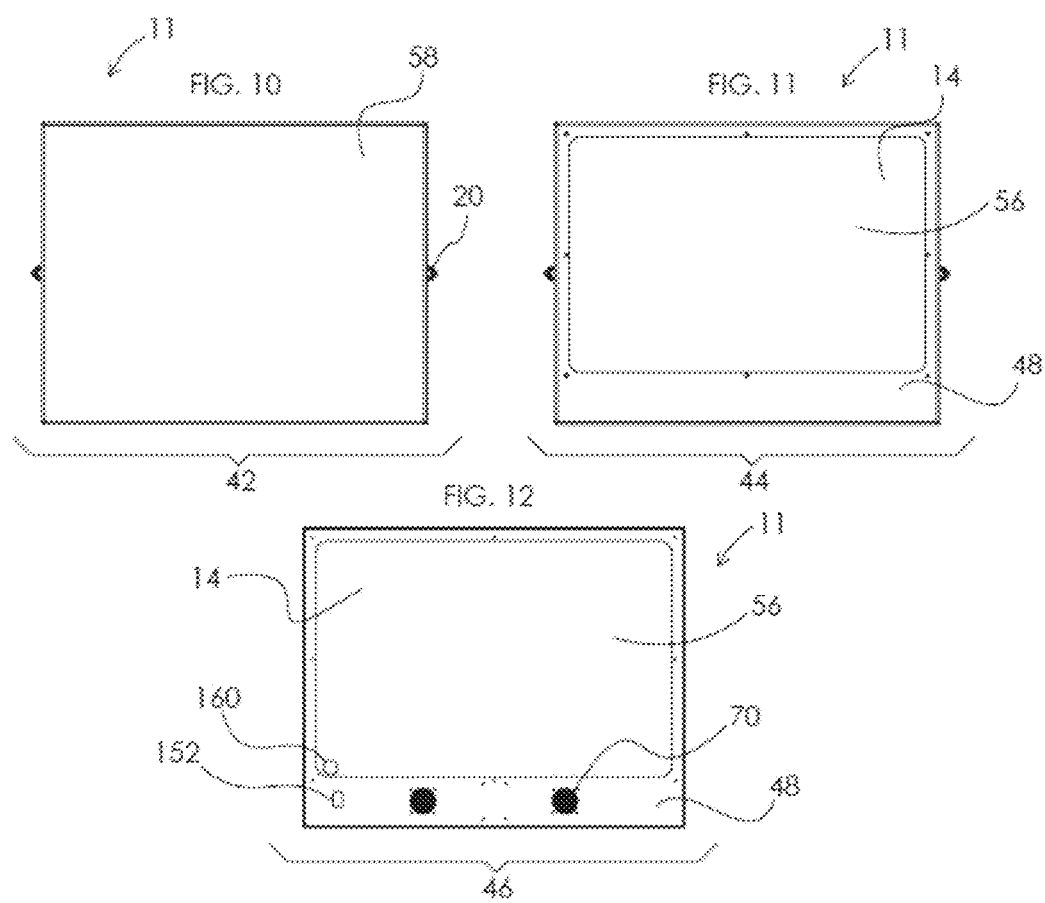

ENCLOSURE DEVICE FOR A VIDEO DISPLAY

CLAIM OF PRIORITY

The present invention claims priority to U.S. Provisional Patent Application 61/837,214 entitled "OUTDOOR ENCLOSURE FOR FLAT-PANEL TELEVISIONS" by Joseph Orion Engle, filed on Jun. 20, 2013, and PCT/US14/43326 entitled "ENCLOSURE DEVICE FOR A VIDEO DISPLAY" by Joseph Orion Engle filed on Jun. 20, 2014, the contents of which are both incorporated herein by reference in their entirety.

FIELD

The present teachings generally relate to enclosure devices, such as enclosures devices for equipment (e.g., electronic equipment) which can be damaged or destroyed if exposed to rain and/or other outdoor environmental hazards, in particular, the present teachings relate enclosure devices for video displays, such as monitors and televisions. For example, the present teachings can be used with a flat panel television.

BACKGROUND

Various method and/or devices of protecting video displays are described in U.S. Pat. Nos. 3,418,426; 5,071,203; 5,033,802; 6,377,320; 6,536,855; 6,709,078; 6,802,575; 7,312,836; 7,388,956; 7,812,891; 8,102,483; 8,350,984; D397,336; D532,413; D627,317; D641,721; D664,129; and D669,075; and in U.S. Patent Application Publication Numbers 2003/0034716 A1; 2008/0123014 A1; 2009/0231807 A1; 2009/0231808 A1; 2010/0136282 A1; 201010171889 A1; 2010/0201905 A1; 2010/0315777 A1; and 2012/10194750 A1 all incorporated herein by reference in their entirety.

These attempts have failed to meet one or more needs for an enclosure device. As such, there continues to be a need for an improved enclosure device meet one or any combination of the following needs a need for an enclosure that is generally tamper resistant/tamper proof; a need for an enclosure that provides improved and/or total protection of an electronic device from rain; a need for an enclosure that provides improved cooling to an electronic device; a need for an enclosure having an amplified speaker external of the electronic device (e.g., external of a display device); or a need for an enclosure having openings for one or more cables that provide a barrier for water entry, that protects an electronic device from rain.

SUMMARY

In one aspect, the present teachings meet one or more of the above needs by providing an enclosure device comprising an enclosure base, an adapter component, a sealing component, an enclosure cover, and one or more securing components. The enclosure base preferably is a vertical tray including a generally vertical back wall having four or more edges and a plurality of side walls wherein each side wall extends from one of the edges of the back wall, wherein each side wall has a forward periphery edge, wherein the plurality of side walls includes a bottom wall, a top wall, a right side wall, and a left side wall, and wherein the back wall has a first set of holes and a second set of holes. The adapter component preferably has a plurality of first openings for attaching the adapter component to the first set of holes of the back wall, and a plurality of second openings for attaching the adapter component to a display device, wherein the first set of openings are not coplanar with the second set of openings. The sealing component preferably comprises a connecting portion and a sealing portion, wherein the connecting portion includes a connection feature for attaching to one or more of the side walls so that the sealing portion at least partially extends forward of the forward periphery edge of the side walls. The enclosure cover preferably has an internal flange wherein the enclosure cover is sufficiently large for covering the entirety of the forward periphery edge of the enclosure base. The one or more securing components preferably attach the enclosure cover assembly to the enclosure base. The securing component preferably creates a compressive force between the enclosure cover assembly and the enclosure base so that the sealing component seals the forward periphery edge of the enclosure base and the enclosure cover assembly, and wherein a cavity is formed for a display mounted on the adapter component. One or more of the walls of the enclosure device preferably includes a cable pass-through component for allowing the connection of a cable from the display in the cavity to a component outside of the cavity without creating an entrance for water, insects, or other contaminants.

In another aspect, the present teachings meet one or more of the above needs by providing an enclosure device for enclosing a display comprising an enclosure base, an adapter plate for attaching to the enclosure base; an enclosure cover for covering the enclosure base and forming a cavity for a display device, wherein the enclosure cover includes a cover frame having one or more speaker openings, wherein the cover frame has a rear surface facing towards the cavity; a sealing component for forming a seal between the enclosure base and the enclosure cover; one or more speakers attached to the rear surface of the cover frame; and an amplifying system attached to at least one of the one or more speakers; wherein the amplifying system includes an amplifier for receiving an input signal, increasing the amplitude of the signal, and producing an output signal and one or any combination of the following: i) an infrared signal reading component for receiving infrared signals; ii) an amplifier power supply; iii) one or more connectors for connecting an audio source and the amplifier; iv) one or more connectors for connecting the infrared signal reading component and the amplifier; or v) one or more connectors between the amplifier for a speaker external to the enclosure device.

Any of these enclosure devices may be further characterized by one or any combination of the following features: the enclosure cover is an enclosure cover assembly including a frame having the internal flange and a clear plate positioned within the internal flange of the frame; the sealing portion seals the clear plate and the forward periphery edge of the enclosure base; the clear plate is attached to the frame; the clear plate has a forward surface having an outer periphery, wherein the enclosure cover assembly does not include a sealing component for sealing the outer periphery of the clear plate to the frame; the plurality of second openings of the adapter plate includes 8 or more openings so that the adapter plate can be used with displays having different arrangements of screw holes; the device includes one or more vents positioned on the bottom wall of the enclosure base; the sealing component includes a bulb seal; the one or more securing features includes a lockable latch; and the device includes one or more speakers and an amplifier connected to the one or more speakers.

The present teachings meet one or more of the above needs by providing a process for mounting a display device to an enclosure device comprising: a step of attaching the display device to an adapter plate; a step of attaching the adapter plate, with the display device attached, to an enclosure base; and a step of covering the sealing base with an enclosure cover so that the display device is in a sealed cavity of an enclosure device.

BRIEF DESCRIPTION OF THE DRAWINGS

FIG. 7 is a perspective view of an illustrative enclosure base.

FIG. 8 is a side view of an illustrative enclosure base.

FIG. 9 is a front view of an illustrative enclosure base.

FIG. 10 is a front view of an illustrative enclosure cover having a solid front wall.

FIG. 11 is a front view of an illustrative enclosure cover having an enclosure cover assembly.

FIG. 12 is a front view of an illustrative enclosure cover including one or more components mounted on the enclosure cover.

DETAILED DESCRIPTION

The explanations and illustrations presented herein are intended to acquaint others skilled in the art with the teachings, its principles, and its practical application, Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes, Other combinations are also possible as will be gleaned from the following claims, which are also hereby incorporated by reference into this written description.

The enclosure device includes an enclosure base and an enclosure cover for covering the enclosure base and forming a cavity for protecting an electronic device.

Figure 1:
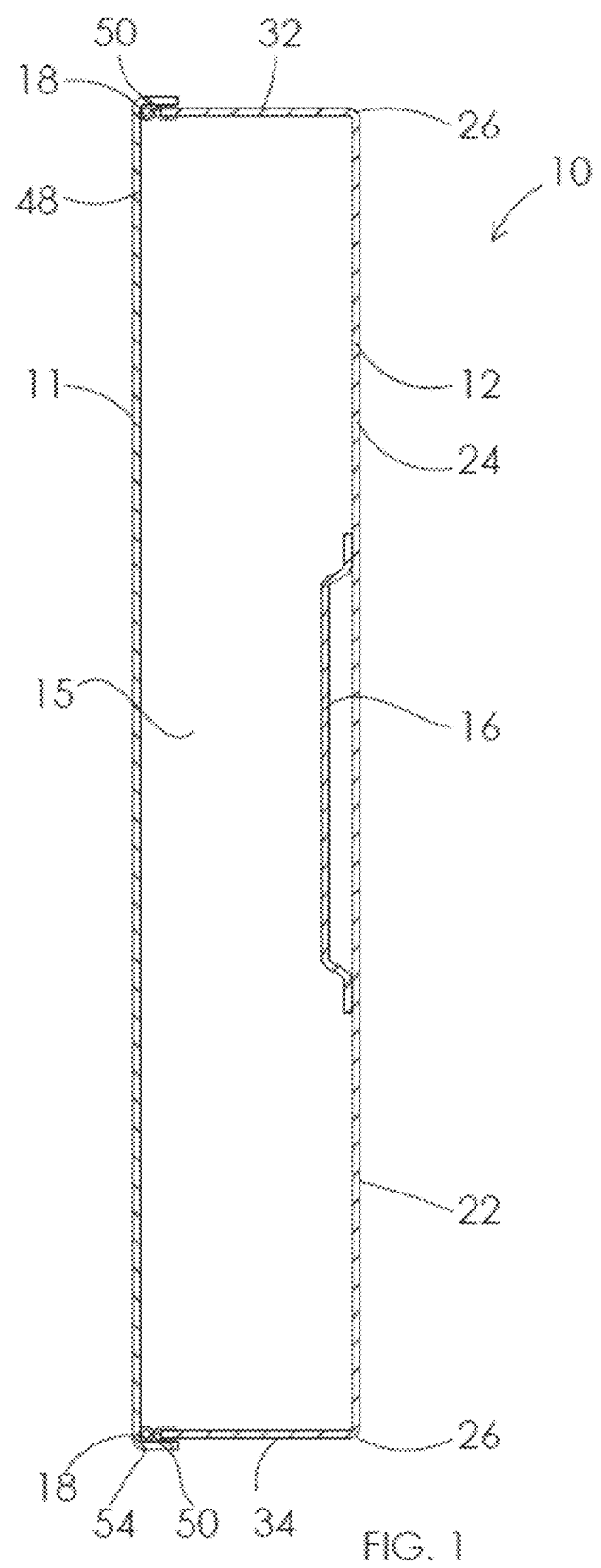
FIG. 1 is an illustrative horizontal cross-section of an enclosure device according to the teachings herein.

The cavity may be substantially sealed from the environment (e.g., from exposure to falling rain, falling snow, falling debris, horizontal wind gusts, or any combination thereof), Preferably the cavity is entirely sealed from the environment. The cavity may have a front region, a back region, a top region, a left region, and a right region which are all protected from the environment. The enclosure device preferably includes one or more sealing components for sealing the cavity. For example the enclosure device 10 may include a sealing component 18 that forms a seal between an enclosure cover 11 and an enclosure base 12, such as illustrated in FIG. 1.

The enclosure base may be a vertical tray. The enclosure base may have a back wall (i.e., a base wall) having four or more edges. The back wall preferably is a generally vertical wall. The enclosure base may have one or more side walls (e.g., four or more side walls), preferably each extending from an edge of the back wall. For example, the enclosure base may include a top wall, a bottom wall, a right wall, and a left wall. One or more of the side walls (e.g., all of the side walls) may extend from the back wall in the forward direction.

Each side walls of the enclosure base preferably has a forward periphery edge. The forward periphery edges may define the forward most portion of the enclosure base. The back wall may define the backward most portion of the enclosure base.

The right wall and left wall preferably are generally vertical walls extending from the back wall. The right wall and the left wall preferably are oriented at about a 90° angle relative to the back wall of the enclosure base.

The top wall and the bottom wall preferably are generally horizontal walls. Most preferably the top wall is angled relative to the horizontal plane so that water on the top wall may roll down an incline and off the top wall. For example, the top wall may form an angle of incline, c, with the horizontal plane of greater than 0°, about 1° or more, about 2° or more, about 3° or more, about or more, or about 5° or more. The angle of incline of the top wall should be sufficiently low so that the top wall can easily be sealed by the enclosure cover. The angle of incline, may be about 30° or less, about 20° or less, about 15° or less, about 10° or less, or about 8° or less. Preferably the incline of the top wall is in the upward direction when moving away from the back wall. The bottom wall may be a horizontal wall. However, the bottom wall may have an inclined so that water entering the cavity may flow down the incline of the bottom wall. As such the bottom wall may have an incline angle, β, such as an incline angle described hereinbefore for the top wall. Preferably the bottom wall inclines in the downward direction moving away from the back wall. As such, the bottom wall may have a first region that is vertically lower than a second region. When the bottom wall has an incline angle greater than 0°, the bottom wall preferably has one or more drainage openings at or near a first region (e.g., at or near a vertically low position) of the bottom wall. The magnitude of the incline angles, α and β, may be the same or different.

One or more of the side walls of the enclosure base may be solid wall that are free of openings when the enclosure device is mounted. Preferably the back wall, the top wall, the right wall, and the left wall are solid walls that are free of openings when the enclosure is mounted.

The enclosure base may include a cable opening for passing one or more cables through the enclosure base. The cable opening preferably is positioned on a wall that is not a top wall so that rain or other falling water does not fall onto the cable opening. The cable opening preferably is positioned on the back wall, the bottom wall, the right wall, or the left wall. The one or more cable openings may be on the same wall or may be on two or more different walls. Preferably one or more (e.g., all) of the cable openings is located on the back wall.

The enclosure base may include one or more mounting component for mounting the back wall. The mounting component may allow for the mounting of the enclosure base in a generally upright orientation. Preferably, the mounting components of the enclosure base are positioned on located on the back wall of the enclosure base. The mounting components of the enclosure base may be a set of one or more first holes. The mounting component may include a sufficient number of first holes for connecting the enclosure base to a wall mount, such as a universal wall mount for a flat panel display. The enclosure base preferably includes two or more first holes, more preferably 3 or more first holes, and most preferably 4 or more first holes. The number of first holes preferably is equal to the number of points or locations that the universal mount connects with the wall mount. For example, the number of first holes preferably is about 12 or less, more preferably about 6 or less, and most preferably about 4 or less. The first holes preferably are internally threaded so that the enclosure base may be attached to a wall mount using fasteners, such as screws or bolts. For example, the shaft of a screw or bolt may fit through an opening of a wall mount and then into an internally threaded hole of the enclosure base for securing the wall mount to the enclosure base.

The enclosure base may include one or more features for attaching the enclosure base to an adapter component (e.g., to an adapter plate). For example, the enclosure base may include a second set of holes or other openings for attaching the enclosure base to an adapter component (e.g., to an adapter plate). The second set of holes preferably is not located on the top wall of the enclosure base. The second set of holes preferably is located on the back wall of the enclosure base. The adapter component according to the teachings herein preferably is attached to an electronic device prior to being attached to the enclosure base.

The enclosure cover may be configured to cover the forward portion of the enclosure base for forming a cavity. For example, the enclosure cover may cover the entirety of the forward edges of the sides of the enclosure base. The enclosure cover may be a single component or element or may be an enclosure cover assembly including a plurality of components or elements.

The enclosure cover and the enclosure base may be provided as separate components. Alternatively the enclosure base and at least a portion of the enclosure cover may be provided as single component. For example, the enclosure base and at least a portion of the enclosure cover may be provided as a molded part having a hinge for opening and closing the enclosure.

The enclosure cover preferably has a front wall sufficiently large for covering the front portion of an electronic component (e.g., a display, such as a flat panel display) in the cavity of the enclosure. The front wall may be generally flat. The front wall may have a generally rectangular shape. The enclosure cover may have one or more side walls (e.g., four or more side walls) extending from the edges of the front wall. For example, the enclosure cover may have a top wall, a bottom wall, a right wall and a left wall. The side walls preferably extend from the front wall towards the back of the enclosure. Preferably the side walls are oriented generally perpendicular to the front wall. It will be appreciated according to the teachings herein that one or more walls (e.g., the top wall) is angled in a downward direction going away from the front wall so that the angle of a wall (e.g., the top wall) of the enclosure cover more closely matches the angle of a corresponding wall (e.g., the top wall) of the enclosure base. By way of example, the top wall of the enclosure cover may have the same angle with the horizontal (i.e., horizontal plane) as the top wall of the enclosure base. The top wall of the enclosure cover may have a different angle with the horizon relative to the angle with the horizontal of the top wall of the enclosure base. For example, the top wall of the enclosure cover may be parallel to the horizon and the top wall of the enclosure base may be angled relative to the horizontal. The bottom wall of the enclosure cover and the enclosure base may both be generally horizontal. Preferably, the bottom wall of the enclosure cover is generally horizontal and the bottom wall of the enclosure base is angled with the horizontal.

The front wall and side walls of the enclosure cover preferably forms an internal flange (facing towards the enclosure base) sufficiently large for receiving the forward portions of the enclosure base. The side walls of the enclosure cover preferably are sufficiently deep (in the direction from front to back) for receiving a sealing portion of a seal component between the enclosure base and the enclosure cover. For example, some or all of a sealing portion of a sealing component may be positioned between the front wall of the enclosure cover and the forward portion (e.g., the forward periphery edges of the side walls) of the enclosure base.

The enclosure cover assembly may include a framing portion that provides an internal flange for receiving a forward periphery of the enclosure base (e.g., for receiving the forward periphery edges of the side walls).

The enclosure cover assembly may include a frame. The frame may have a front wall (e.g., a forward wall of the enclosure device). The front wall preferably has a opening sufficiently large for viewing a portion of an electronic device in the cavity of the enclosure device. For example, the opening may be a screen opening that is sufficiently large for viewing some or preferably al of the screen of a display device. The front wall may have an outer periphery edge. The frame preferably includes the side walls of the enclosure cover, as described hereinbefore. According to the teachings herein, the frame may include an internal flange (i.e., the internal flange of the enclosure cover) for receiving the forward periphery edge of the side walls of the enclosure base. The frame may have an internal periphery region around the opening.

The enclosure cover assembly may include a clear plate for viewing the electronic device in the cavity of the enclosure device. The clear plate may be sufficiently large so that the clear plate covers the entirety of the opening (e.g., the screen opening) of the frame. Preferably the clear plate is sufficiently large so that the clear plate covers the internal periphery region of the screen opening of the frame. As such, the clear plate may overlap a portion of the frame. For example, the region of overlap of the clear plate and the frame may be sufficient for attaching the clear plate to the frame (e.g., to the front wall of the frame). Most preferably, the clear plate is sufficiently large so that it covers substantially the entirety or the entirety of the inside of the front wall of the frame. For example, the clear plate may be sufficiently large so that the clear plate overlays substantially all of (e.g., entirely al of) the forward periphery edges of the side walls of the enclosure base (e.g., when the enclosure base is positioned in the internal flange of the frame of the enclosure cover).

The clear plate may be made of any material that is sufficiently transparent so that the electronic device can be seen. For example, the clear plate may be sufficiently transparent so that a display, such as a flat panel television, can be watched. The clear plate may be tinted or free of tinting. The clear plate may include one or more features for reducing glare. The clear plate may include one or more features for increasing the scratch resistance and/or impact resistance of the plate. For example, the clear plate may include a scratch resistant coating. Preferred plates are plates including, consisting essentially of, or consisting entirely of a layer of glass or a layer of a transparent polymer. Preferred materials for the clear plate are materials having a refractive index of about 1.1 or more, more preferably about 1.3 or more, even more preferably about 1.5 or more, and most preferably about 1.6 or more. Examples of polymers that may be employed in a clear plate (e.g., in a layer of a transparent polymer) include polycarbonates, polycarbonate copolymers, polyferrocenes, polyferocenylsilanes, polyamides, polyamide copolymers, polyacrylates (e.g., polymethylacrylate or polymethylmethacrylate), polyacrylate copolymers, acrylics, acrylic copolymers polystyrene, and polystyrene copolymers.

The enclosure device includes an adapter component for supporting an electronic device in the cavity of the enclosure device and attaching the enclosure device to one or more walls of the enclosure device. The enclosure device includes a first portion (e.g., a front portion) for attaching to the electronic device, a second portion (e.g., a rear portion) for attaching to the enclosure base and or enclosure cover, and a connecting portion that connects the first portion and the second portion of the adapter component. Preferably, the second portion is a rear portion for attaching the adapter component to one or more walls of the enclosure base. For example, the second portion may attach to the back wall of the enclosure base.

The adapter component may be capable of mounting to a display device. For example, the adapter component may be attached to the display using threaded bore holes in the display device. The display device may include two or more, preferably four or more threaded bore holes. The bore holes in the display device may be arranged in a standard pattern for a universal mount, such as a pattern compliant with the Video Electronic Standards Association (i.e., VESA) for Flat Display Mounting Interface (FDMI, also known as VESA Mounting Interface Standard or "VESA mount"). The pattern of bore holes in the display device may vary depending on the size of the display device.

The first portion of the adapter component may have a plurality of first openings for attaching the adapter device to the display device using fasteners (e.g., screws and/or bolts). The first portion of the adapter component preferably has a sufficient number of first openings for attaching the adapter component to the electronic device (e.g., the display device). The first portion of the adapter component more preferably has a sufficient number of first openings for attaching the display device to any of a number of different sized display units (e.g., having different VESA mount patterns). As such, the first portion of the adapter component preferably has 4 or more first openings, more preferably 6 or more first openings, and most preferably 8 or more first openings. The first portion of the adapter components may have additional first openings so that the height of the display device in the cavity can be adjusted. For example, the first portion of the adapter device may have an array of first opening arranged in two or more columns and two or more rows. The number of columns in the array preferably is three or more, more preferably four or more. The number of rows in the array may be 2 or more rows, preferably 4 or more, more preferably 6 or more, and most preferably 8 or more. The first portion of the adapter component preferably is generally planar so that the adapter component can generally mate against a display device having a generally planar back surface. As such, the first opening may be arranged on a first plane. The first openings preferably include holes and/or slots and most preferably are holes.

The second portion of the adapter component preferably has a sufficient number of second openings for attaching the adapter component to the enclosure base. For example the second portion may attach to the back wall of the enclosure base. Preferably the adapter component creates a space between the back wall of the enclosure base and the back of the display device. As such, the second openings preferably are on one or more planes that are different from the first plane (of the first openings). For example, the second openings may be arranged on a second plane that is spaced apart from the first plane. The second plane may be generally parallel to the first plane. The spacing between the first plane and the second plane preferably has a sufficiently high distance so that air can cool the back of the display device. For example, the distance between the first and second planes so that air can circulate behind the display device for cooling of the display device. The distance between the first and second planes preferably is about 1 mm or more, more preferably about 3 mm or more, even more preferably about 6 mm or more and most preferably about 10 mm or more. The distance between the first and second planes should be sufficiently small so that a narrow depth of the enclosure device is maintained. Preferably, the distance between the first and second planes is about 500 mm or less, more preferably about 200 mm or less, even more preferably about 100 mm or less, and most preferably about 50 mm or less. The second portion of the adapter component preferably has three or more second openings, more preferably four or more second openings for attaching the adapter component to the enclosure base. The adapter component preferably has a height that is greater than the height of any display device that may be attached to the adapter component. The second portion of the adapter component preferably has a top region located above the display device and/or above the opening of the enclosure cover, the second portion of the adapter component preferably has a bottom region located below the display device and/or below the opening of the enclosure cover. The second openings preferably includes one or more (e.g., two or more) openings near each of the top and bottom regions of the second portion of the adapter component. The second openings preferably include holes and/or slots and most preferably are holes.

The adapter component has a connecting portion for connecting the first portion and the second portion. The connecting portion should be sufficiently rigid so that the spacing between the first plane and the second plane is generally maintained.

The adapter component may be configured to improve the efficiency of air flow for cooling an electronic device. The adapter component may be configured for creating a flow path behind the electronic device. For example, air may be forced up one side behind the display device and the adapter component may present a barrier so that lateral flow of air is reduced or eliminated. After reaching the top region of the adapter component, the air flow may pass above the display device and flow down the other side behind the display device. The cooling of the electronic device may include a first ventilation opening at the start of the flow path and a second ventilation opening at the end of the flow path. The first ventilation opening preferably is located on the bottom wall of the enclosure base. The second ventilation opening preferably is located on the bottom wall of the enclosure base. The enclosure device preferably has one or more fans for increasing the flow of air through ventilation openings. The first and second ventilation openings are preferably spaced apart. For example, the first and second ventilation openings may be on the bottom wall of the enclosure base with one being positioned near the right wall and the other near the left wall of the enclosure base.

The adapter component may be in the form of an adapter plate. The adapter plate, may have a generally uniform cross-section in the horizontal plane. The adapter plate may have a left side and a right side that forms at least some of (e.g., all of) the first portion of the adapter component. The adapter plate may have a central region between the right and left sides that forms at least some of (e.g., all of) the second portion of the adapter component. The connecting portion of the adapter plate may include i) a region that connects the central region and the left region and ii) a region that connects the central region and the right region.

The adapter component preferably is formed of, or consists essentially of a single plate. The adapter component preferably is formed of a material that is sufficiently strong so that the adapter component can support the weight of the electronic device (e.g., a flat panel display). Preferably, the adapter component is formed of a metal plate.

The enclosure device preferably includes a sealing component for sealing the cavity of the enclosure device. The sealing component preferably includes a sealing portion that functions as a seal. The sealing component may include a connecting portion for attaching the sealing component to the enclosure base or to the enclosure cover. The sealing component preferably is not attached to both the enclosure base and the enclosure cover, so that the enclosure device can be opened.

If present, the connecting portion may be rigid (e.g., have a relatively high flex modulus, as measured according to ASTM D-790) relative to the sealing portion. The connecting portion may be attached to the sealing portion, and preferably is directly attached to the sealing portion.

The sealing component preferably is attached to either the enclosure base or the enclosure cover. The sealing portion and/or the connecting portion may be attached to the enclosure base or enclosure cover using an adhesive, using fasteners, by welding, a mechanical attachment, or any combination thereof. Preferably, the sealing portion is not directly attached to the either the enclosure base or the enclosure cover. For example, the sealing portion may be attached via the connecting portion. The connecting portion is preferably attached directly to the enclosure base or the enclosure cover. The connecting portion is preferably mechanically attached to the enclosure base or the enclosure cover. The mechanical attachment may be any mechanical attachment known in the art. For example, the connecting portion may include one or more features that mechanically attaches to a corresponding feature of the enclosure cover or the enclosure base. By way of example, the connecting portion may include one or more channels suitable for receiving an edge portion of a side wall of the enclosure base or enclosure cover.

The sealing component may have a generally uniform cross-section along the length of the sealing component. As such, the sealing component may be formed by a profile extrusion of one or more polymeric materials. For example, the sealing component may be formed by a co-extrusion including a first material for the connecting portion and a second material for the sealing portion, wherein the first material has a relatively high flex modulus relative to the second material (e.g., as measured according to ASTM D-790). By way of example, the second material may be a foamed material so that the flex modulus (of the foamed material) is lower than the flex modulus of the first material.

The sealing portion may have a sufficiently low flex modulus so that it can be deformed for sealing the enclosure device. Preferably the sealing portion is formed of one or more polymeric materials. The sealing portion may include a foamed material. The sealing portion preferably is formed of an elastomer, a thermoplastic elastomer, a thermoplastic vulcanizate, a thermoplastic (e.g., a homopolymer or a copolymer) having low crystallinity (e.g., about 25% or less) and a low glass transition temperature (e.g., preferably about 20° C. or less, more preferably about 0° C. or less, and most preferably about −20° C. or less).

The sealing portion may have a cross-section that includes one or more openings. By way of example, the sealing portion may be a bulb seal. When compressed between two components (e.g., between the enclosure cover and the side wall edges of the enclosure base) the bulb seal may flatten seal the two components. When the enclosure cover is an enclosure cover assembly, the sealing portion (e.g., the bulb seal) preferably is positioned between the clear plate and the side wall edges of the enclosure base.

It will be appreciated that an enclosure device according to the teachings herein may have a clear plate and a frame that includes regions that are not sealed. Although the two components may be pressed together by compressive forces, there may be some gaps that allow water to flow down the outside surface of the clear plate. As such water may flow between the clear plate and the frame. However, here the clear plate preferably extends to near the bottom of the cavity and the cavity preferably is sealed with a seal between the clear plate and the cover base, so that the water will not enter the cavity. If water does the cavity, it preferably flows out one or more drain openings in the bottom wall. For example, the water may flow down down the slope of a bottom wall and out the drain opening(s).

The enclosure device may include one or more (e.g., two or more) securing components for securing the enclosure cover to the enclosure base and/or for providing a compressive force for sealing the enclosure cover to the enclosure base using the sealing portion of a sealing component position between the cover and base. Preferably the one or more securing components applies a compressive force around a perimeter of the sealing component. When the enclosure device includes a clear plate, the securing component preferably applies a compressive pressure to the sealing component for creating a seal (e.g., a water proof seal) between the clear plate and the forward periphery edges of the side walls of the enclosure base.

The securing component may include a first portion that is attached (e.g., integrated with, attached with one or more fasteners, or otherwise attached) to the enclosure cover and a second portion that is attached (e.g., integrated with, attached with one or more fasteners, or otherwise attached) to the enclosure base. The securing component may include one or more latches. The first portion and the second portions of the securing component are preferably mating mechanical parts that engage to fasten the enclosure cover and the enclosure base.

Examples of latches which may be employed include latches including a strike plate and/or keeper, a hook latch, a crossbar latch (e.g., bolt latch), a Norfolk latch, a Suffolk latch, a cam lock, a slam latch, a spring latch, a draw latch (e.g., a spring loaded draw latch), and a catch latch. A particularly preferred latch is a draw latch.

One or more of the securing components may be lockable. For example, the securing component may include a lock so that a key is required for opening the lock. The key may be a mechanical key, a combination, or a signal (such as an electrical signal or infrared signal). Alternatively the securing component may include an opening or other feature for receiving a locking device so that the securing component can be opened only upon unlocking and/or removing the locking device. By way of example, the securing component may include a lockable latch and/or a latch having an integrated lock.

A securing component may have portions that are integrated with, mounted, welded, or otherwise attached to corresponding walls (e.g., corresponding top walls, corresponding right walls, corresponding left walls, and/or corresponding bottom walls) of the enclosure base and the enclosure cover. For example, a first portion of the securing component may be attached to a wall of the enclosure base and a second portion of the securing component may be attached to a wall of the enclosure cover. The enclosure device may include one securing component attached to a set of corresponding sides or walls (e.g. to right walls) of the base and cover and a second securing component attached to an opposing set of corresponding sides or wall (e.g., to left walls) of the base and cover. The enclosure device may have a single securing component. When the enclosure device has a single securing component, the enclosure device preferably has one or more hinges. The one or more hinges preferably are located on the side of the enclosure device opposite the side that the securing device is located. For example, one or more hinges may be on the left side (e.g., connecting the left wall of the enclosure base with the enclosure cover) and the securing component may be on the right side (e.g., connecting the right wall of the enclosure base with the enclosure cover).

Preferably the first and second portions of the securing components are respectively attached to the enclosure base and the enclosure cover with tamper resistant fasteners or other features (such as a weld and/or an integrated component) so that the portion cannot generally be removed from the enclosure component (base or cover) or can only be removed when the enclosure device is in an open configuration (e.g., unlocked and/or unlatched).

The enclosure device preferably includes one or more features to improve the tamper resistance of the device. For example, the enclosure device may include one or more locking components for locking the enclosure base to the enclosure cover. When locked, the ability for an individual to open the enclosure cover without a key (e.g., a mechanical key or a combination key) is reduced or eliminated, thus protecting the electronic device in the cavity of the enclosure device from being tampered with. As another example, one or more of, or even all of the components attached to the enclosure base and/or to the enclosure cover may be attached using tamper resistant fastener systems. Fastener systems are two or more fastener components that cooperatively fasten together, such as a combination of a screw and a nut, or a combination of a bolt and a nut. Preferred fastener systems are fastener systems that are generally tightened and loosened from only one side of the fastener system. As such, essentially all of (or entirely all of) the tightening and/or loosening may occur by rotationally engaging (by hand or with a tool such as a wrench or driver) a portion of the fastener system that is generally inside the enclosure device (e.g., when the enclosure base is covered by the enclosure cover). Preferred fastener systems may include a component having exposed portions (e.g., fastener portions that extend from an outer surface of the enclosure device) that have circular symmetry. Such circular symmetry makes it more difficult to remove a fastener when the enclosure is closed and thus improves the tamper resistance of the enclosure device. By way of example, preferred fastener systems may include a rivet nut and/or a carriage bolt. Other tamper resistant fastener systems include fastener systems that have an adhesive material for adhering two portions of the fastener system and/or for adhering a portion of the fastener system to the enclosure base or to the enclosure cover.

Two or more components of an enclosure cover assembly may be attached with a fastener system, an adhesive, a weld, a braze or any combination thereof. For example a frame and a clear plate may be attached using one or more tamper resistant fastener systems.

Preferably any securing component attached to the enclosure cover and/or enclosure base are attached using one or more tamper resistant fastener systems, such as a temper resistant fastener system according to the teachings herein.

Preferably the adapter component is attached to the base component using one or more tamper resistant fastener systems, such as a temper resistant fastener system according to the teachings herein.

The enclosure device may include one or more additional electronic components for use with a display device. For example, the enclosure device may include one or more fans, one or more surge protectors, one or more signal receivers, one or more switches, one or more amplifiers, one or more speakers, one or more controllers, or any combination thereof. The enclosure device may include one or more fans for cooling the cavity of the enclosure device. The enclosure device may include one more surge protectors for protecting the display device or any of the other electronic components (such as electronic components according to the teachings herein) from electrical surges. A single surge protector may protect more than one electronic device and or component.

The enclosure device may include an amplifier for amplifying or otherwise controlling the amplitude of the sound. The amplifier may be connected to one or more speakers. These amplified speakers may be inside the enclosure device or outside the enclosure device. If a speaker is at least partially inside the enclosure device, it preferably is mounted to a wall of the enclosure device having one or more speaker openings. The speaker may be mounted using one or more seals or gaskets so that water does not enter the enclosure cavity through the speaker opening. The amplifier may be mounted or otherwise attached to a wall of the enclosure device. For example, the amplifier may be mounted to a wall of the enclosure device using one or more fasteners through an opening of the wall. The attachment of the amplifier to a wall may employ one or more gaskets or seals so that water does not enter the cavity of the enclosure device. Preferably, the one or more speakers and any amplifiers are attached to the front wall of the enclosure cover (e.g., to the front portion of the frame).

The enclosure device may include one or more switches mounted or otherwise attached to the device. For example, the enclosure device may include a power switch for controlling the power to one or more electronic components or devices in the cavity of the enclosure device, such as an amplifier, a video display, a surge protector, or any combination thereof. Preferred switches are sealed (e.g., using one or more seals or gasket) so that any opening in the wall of the enclosure device for the switch does not allow water to enter the cavity of the enclosure device. Preferably, the switch is positioned on and/or attached to the front wall (e.g., of the enclosure cover), a side wall (e.g., of the enclosure base), or a bottom wall (e.g., of the enclosure base).

The enclosure device may include one or more signal receivers for receiving a signal from outside the enclosure device. For example, the signal receiver may receive an RF signal and/or an infrared signal. The one or more signal receivers may be connected to a controller, to an amplifier, to a display unit or any combination thereof. The signal receiver may permit the control of one or more features using a remote control device. For example, the signal receiver may allow for controlling the power to the electronic device, for controlling the sound amplitude of speakers, for controlling an input or output of the electronic device, or any combination thereof. The signal receiver preferably is positioned on the inside of the cavity of the enclosure device and oriented for receiving a signal through the clear plate of the enclosure cover. The signal receiver may be attached to the clear plate. The signal receiver may have one or more receiving surface that receives the signal. The receiving surface preferably faces towards the clear plate, is attached (e.g., adhered) to the clear plate, or both.

When a component is attached to a wall of the enclosure device using one or more fasteners that pass through an opening of the wall, the opening is preferably sealed using a gasket or other seal. When the wall is a front wall and the opening of the wall includes an opening through the clear plate and the frame, the gasket or seal is preferably on the inside of the clear plate (e.g., between the electronic device and the clear plate). As such, there may be no seal or gasket between the clear plate and the frame.

The enclosure device may include one or more cable pass through components for passing one or more cables through a wall of the enclosure device. The cable pass through component may include one or more cable inserts and/or one or more cable grommets for receiving a cable. The cable pass through component may be configured so that the cable can connect an electronic device inside the cavity of the enclosure device to a component outside of the enclosure device. For example, the cable may connect the electronic device to a power source, a video signal source, an audio signal source, an external speaker, or any combination thereof. The cable pass through component may include an insert having an opening for holding the cable. The cable pass through component may include an insert having a slit extending from an outside wall of the insert to the opening for positioning a section of the cable from outside the opening of the insert to the opening of the insert (e.g., without having to pass a cable end through the opening). The opening of the insert may be sufficiently small so that a generally water proof seal is formed between the cable insert and the cable. The cable insert may be formed from a material that is sufficiently flexible so that the insert can be bent near the slit for positioning the cable into the opening. The cable insert may be formed from a material that is sufficiently flexible so that the insert can form a seal against cables having a range of sizes (e.g., thickness or diameter), from a minimum size ($t_{min}$) to a maximum size ($t_{max}$). The ratio of $t_{max}$ to $t_{min}$ may be about 3 or less, about 2 or less or about 1.6 or less. The ratio of $t_{max}$ to $t_{min}$ may be about 1 or more, preferably about 1.02 or more, more preferably about 1.05 or more, even more preferably about 1.10 or more, even more preferably about 1.20 or more and most preferably about 1.30 or more. The cable insert and/or cable grommet may have one or more circumferential walls having a groove or channel. The groove or channel may be employed for securing the insert or grommet to a corresponding opening in a wall of the enclosure device. For example, the cable insert may be attached to the front wall of the enclosure cover, to the rear wall of the enclosure base, to a right wall, to a left wall, or to a bottom wall. Preferably the cable insert is attached to the rear wall of the enclosure base so that cables can be hidden from view.

Surfaces and/or components of the enclosure device may be formed of materials that are weather resistant and/or have a weather resistant coating. As used herein, a weather resistant material or coating includes those that are generally resistant to corrosion, generally resistant to color changes when exposed to UV light, generally resistant to environmental stress cracking, or any combination thereof. The surfaces and/or components of the enclosure device may be resistant to fungal growth, may be resistant to cracking during thermal cycling of ambient temperatures, or both. Preferred the materials are generally light weight so that the weight of the enclosure device is reduced or minimized, Examples of materials that may be employed include polymeric materials, aluminum, titanium, glass, and stainless steel. Some or all of the surfaces of the enclosure device may be coated for improved appearance and/or for improved weather resistance. Preferably one or more of the following components (e.g., all of the following components), if present, is formed of a weather resistant material and/or includes a weather resistant coating: an enclosure cover, an enclosure base, a frame, a clear plate, a sealing component, a fastener, a speaker, a fan, a securing device, a cable insert and/or grommet, a switch, or an adapter component.

The enclosure device according to the teachings herein may be employed for mounting a display device. The process for mounting a display device may include one or any combination of the following steps: connecting one or more cables to the display device; attaching (e.g., fastening) a display device to the adapter component (preferably using a plurality of second openings of the adapter component); attaching (e.g., fastening) the adapter component (e.g., with the display device attached) to a wall of the enclosure base (preferably using the first openings of the adapter component and/or the first holes of the back wall of the enclosure base); inserting a cable through an opening in the cable pass through component (e.g., without passing a terminal end of the cable through the opening); connecting the display device to an amplifier and/or speaker; positioning the forward periphery edges of the enclosure base into the internal flange of an enclosure cover; forming a seal between the enclosure base and the enclosure cover (e.g., forming a seal between the enclosure base and a periphery of a clear plate of the enclosure cover); securing the enclosure cover to the enclosure base (e.g., using a latch, such as a latch for creating a compressive force between the enclosure base and the enclosure cover); locking the enclosure base to the enclosure cover (e.g., using one or more lockable latch and locks); or mounting the enclosure device (e.g., mounting the enclosure device to using a universal mount using the second holes in the back wall of the enclosure base).

FIG. 1 is a horizontal cross-sectional view of an illustrative enclosure device. The enclosure device 10 may have an enclosure cover 11, an enclosure base 12, a sealing component 18, and an adapter component 16. The enclosure cover 11 may include or consist essentially of a frame 48 having a forward wall (i.e., a front wall) 52 and side walls 54 extending from the edges of the forward wall 52. The enclosure cover 11 (e.g., the frame of the enclosure cover) may have an internal flange 50. The enclosure base 12 may have be a vertical tray 22. The enclosure base 12 may have a back wall 24 having edges 26 and side walls 28, 30 extending from the back wall 24. The enclosure cover 11 preferably has a shape and size so that the edges of the side walls 28, 30 fit into the internal flange 50. The sealing component 18 may create a seal between the enclosure base 12 and the enclosure cover 11. With reference to FIG. 1, a portion of the adapter component 16 may contact the enclosure base and a portion of the adapter component may be spaced apart from the enclosure base 12. As such, there may be a gap between a portion of the adapter component 16 and the enclosure base 12. The enclosure device has a cavity 15 that is preferably a sealed space.

Figure 2:
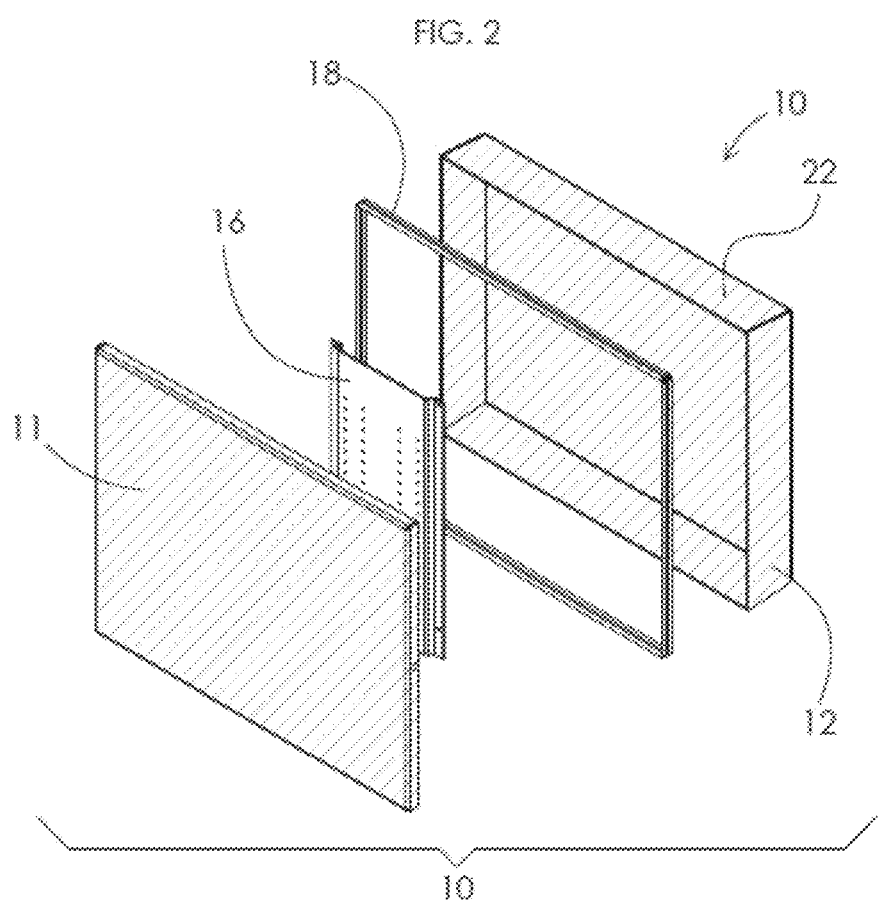
FIG. 2 is an exploded view of an illustrative enclosure device.

FIG. 2 is an exploded perspective view illustrating features of an enclosure device according to the teachings herein. The enclosure device 10 includes an enclosure base 12. The enclosure base 12 may generally be in the form of a vertical tray 22. The enclosure device includes an adapter component 16. The adapter component 16 may be configured to fit inside the vertical tray 22. The enclosure device 10 has an enclosure cover 11 for covering the enclosure base 12. The enclosure device 10 has a sealing component 18 for forming a seal between the enclosure base 12 and the enclosure cover 11.

Figure 3:
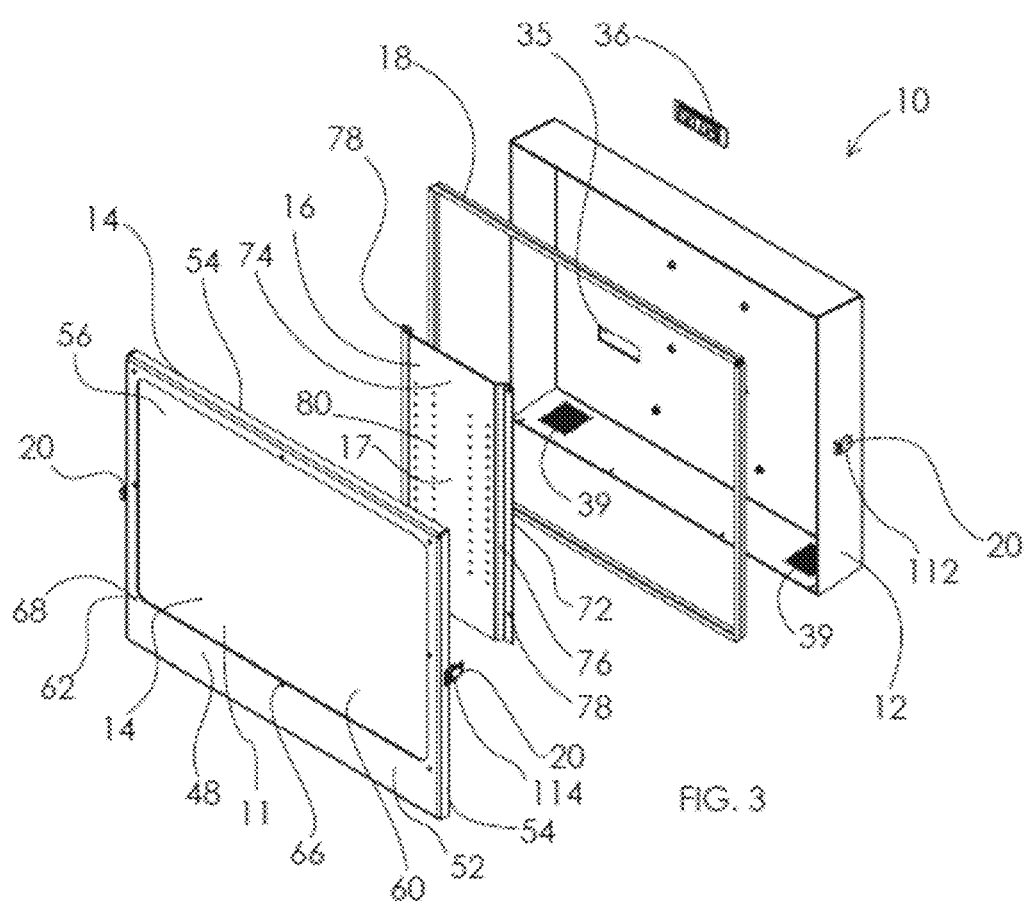
FIG. 3 is an exploded view of an illustrative enclosure device.

FIG. 3 is an exploded perspective view of an enclosure device 10 illustrating features that may be employed in an enclosure device according to the teachings herein. It will be appreciated that the enclosure device may include some or all of the features illustrated in FIG. 3. The enclosure device 10 may have an enclosure cover 11 that is an enclosure cover assembly 14. The enclosure cover assembly may include a frame 48. The frame 48 preferably has a screen opening 56 for viewing a display device in the enclosure device 10, The enclosure cover 11 may have a front wall (i.e., a forward wall) 52 and side walls 54. The side walls 54 may extend from the edges of the forward wall 52 toward the back of the enclosure device 10. The side walls 54 of the enclosure cover 11 may be generally perpendicular to the front wall 52. The side walls 54 of the enclosure cover 11 may include a top wall and an opposing bottom wall that are generally horizontal. The side walls 54 may include a left wall and an opposing right wall that are generally vertical. The enclosure cover assembly 14 may include a clear plate 60 that covers the screen opening 56. The enclosure cover assembly may include one or more clear plate attachment components 62 for attaching the clear plate 60 to the frame 48. For example, the clear plate 60 and the frame 48 may be attached using one or fasteners 68 that using holes or other openings 64 in the frame and in the clear plate. Preferably, the clear plate 60 and 48 are attached using a plurality of rivets. The enclosure cover 11 may have one or more securing components 20 for securing the enclosure cover 11 to the enclosure base 12. For example, a first portion of a securing component 114 may be attached to the enclosure cover and a second portion of the securing component 112 may be attached to the enclosure base. With reference to FIG. 3, the enclosure device 10 may include a plurality of securing components 20, such as a first securing component on one side (e.g., a right wall) of the enclosure device and a second securing component on opposing side (e.g., a left wall) of the enclosure device. The enclosure device 10 has an adapter component 16. The adapter component 16 may be in the form of an adapter plate 17. The adapter component 16 preferably has a rear portion 72 that is positioned rearward of a front portion 74. The rear portion 72 and the front portion 74 are connected by one or more connecting portions 76. The adapter component 16 may have one or more first openings 78 positioned on the rear portion 72. The first openings 78 may be employed for attaching the adapter component 16 to a base component 12. The front portion 74 of the adapter component 16 may have one or more second openings 80. The second openings 80 may be employed for attaching the adapter component 16 to a display device. The second openings 80 may be present in an array including 2 or more columns, 3 or more columns, or four or more columns. The enclosure base 12 preferably has one or more ventilation openings 39. A ventilation opening 39 may be employed for flowing air into and/or out of the enclosure device. The enclosure base 12, may include a cable opening 35 for a cable pass through component 36.

Figure 4:
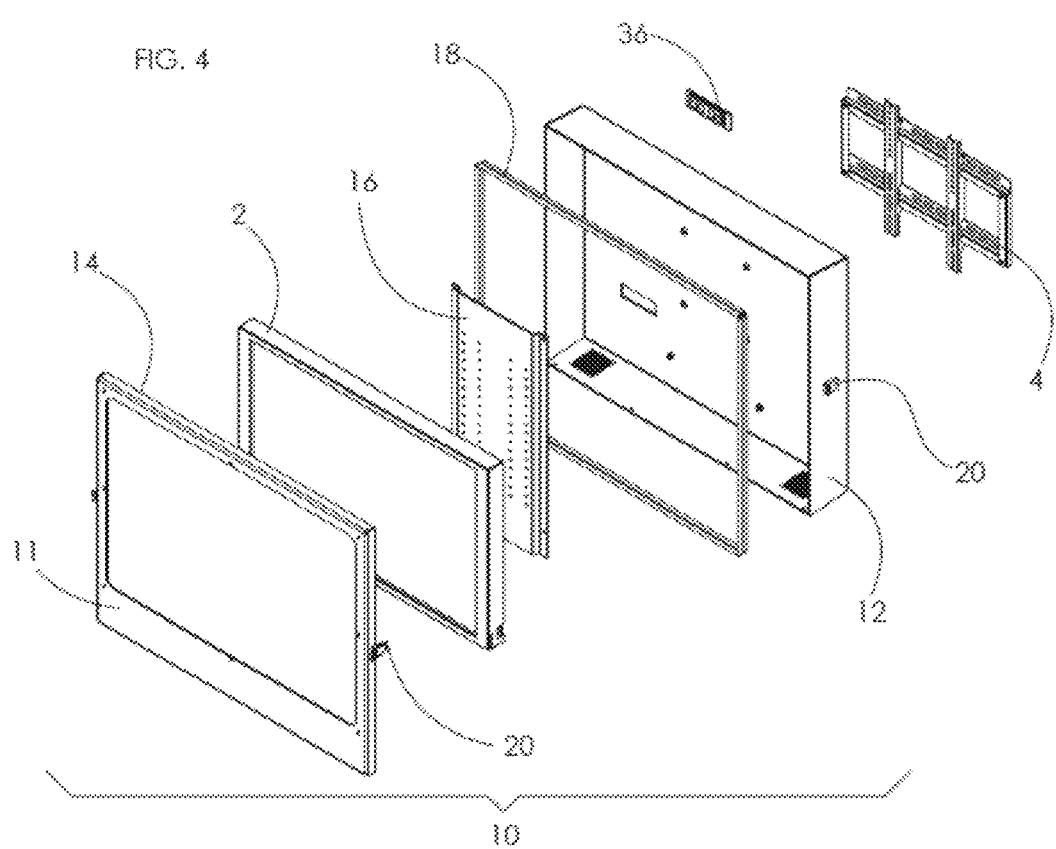
FIG. 4 is an exploded view of an illustrative enclosure device, a display device and a mounting component according to the teachings herein.

FIG. 4 is an illustrative exploded perspective view drawing showing how the enclosure device 10 of FIG. 3 may be employed with a display device 2 and/or a mount 4. With reference to FIG. 4, a display device 2 may be positioned between an adapter plate 16 and an enclosure cover 11. The display device 2 may be attached to the front portion 74 of the adapter component 16. For example, the display device 2 may be attached to the front portion 74 using one or more (preferably 4 or more) of the second openings 80 of the adapter component 16. A mount (e.g., a universal mount or other standard mount) 4 may be positioned behind the enclosure base 12 for mounting the enclosure device 10. As such, the mount 4 may be employed for mounting the enclosure device 10 on a vertical structure such as a wall, a post, a pole, or a tree.

Figure 5:
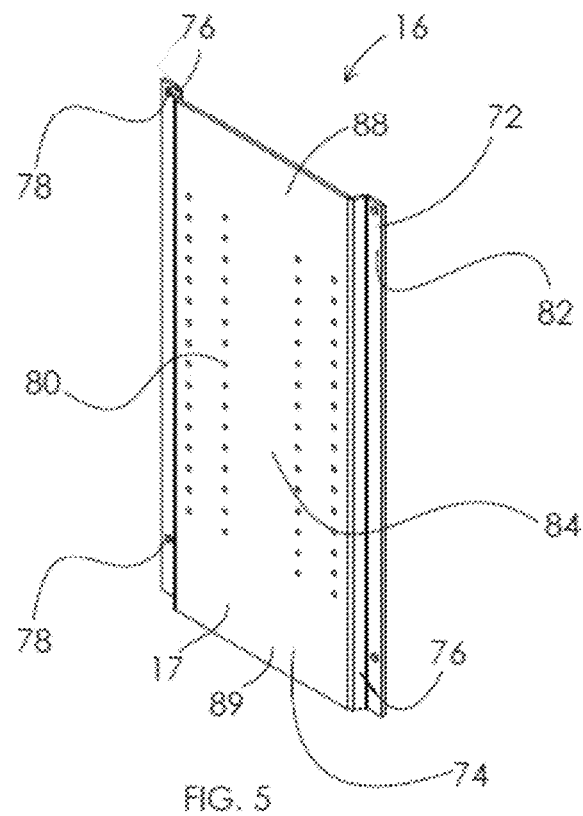
FIG. 5 is a perspective view of an illustrative adapter component.
Figure 6:
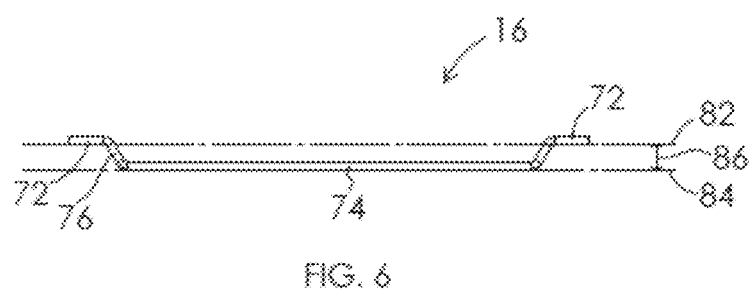
FIG. 6 is a top view of an illustrative adapter component.

FIG. 5 illustrates features of an adapter component 16 that may be employed in an enclosure device according to the teachings herein. The adapter component 16 may be have a generally long height so that a top portion 88 of the adapter component 16 extends above the display device and a bottom portion 89 that extends below the display device. FIG. 6 is a top view of the adapter plate shown in FIG. 5 illustrating that the front portion 74 of the adapter plate 16 may generally lie on a first plane 82 and the rear portion 72 may generally lie on a second plane 84 that is different than the first plane 82. The first plane 82 and the second plane 84 may be generally parallel. The first plane 82 and the second plane 84 may be spaced apart, such as by a gap distance 86. As such, the display device 2 may be separated from the back wall of the enclosure base 12 by a distance of about the gap distance.

The adapter component may be a singular monolithic piece, such as illustrated in FIGS. 5 and 6. The two rear plate portions 72 of the adapter component may extend outward from the connector portions 76 in opposing directions (preferably on a plane parallel to a plane of the front plate portion 74 and/or away from the front plate portion), such as illustrated in FIGS. 5 and 6.

FIGS. 7, 8 and 9 are drawings of an enclosure base 12 illustrating features that may be employed in an enclosure device according to the teachings herein. FIG. 7 is a perspective view, FIG. 8 is a right side view, and FIG. 9 is a front view. The enclosure base may be in the form of a vertical tray 22. The enclosure base 12 may have a back wall 24. Preferably the back wall 24 is a generally vertical wall. The back wall 24 may be generally perpendicular to the forward wall 52 of the enclosure cover 11. The back wall 24 may have side walls extending from the edges 26 of the back wall 24. Preferably the enclosure base 12 has four or more side walls. For example, the enclosure base 12 may have a bottom wall 28, a top wall, 30, a left wall 32, and a right wall 34. With reference to FIG. 8, the bottom wall 28 may be sloped relative to the horizon 150 at an angle of incline, α, 29. Preferably the bottom wall 28 slopes down and forward going from the back wall 24. With reference to FIG. 8, the top wall 30 may be sloped relative to the horizon 150 at an angle of incline, β, 31. Preferably the top wall 30 slopes upward and forward going from the back wall 24. The enclosure base has a forward periphery edge 37 in the forward region of the enclosure base 12. The forward periphery edge 37 may be the edges of the side walls 26, 28, 30, 32 of the enclosure base 12 in the forward direction. The enclosure base 12 may have one or more ventilation openings 39. For example, the enclosure base 12 may have a first ventilation opening 39 in the bottom wall 28 near the right wall 34 and a second ventilation opening 39 in the bottom wall 28 near the left wall 32. The enclosure base 12 may have one or more first holes 38 for attaching the adapter plate 16 to the back wall 32. One or more of the first holes 38 are preferably located on the back wall 24 near the top wall 30. One or more of the first holes 38 are preferably located on the back wall 24 near the bottom wall 28. The enclosure base 12 may have one or more second holes 40 for attaching the back wall 24 to a mount 4.

FIG. 10 is a front view of an illustrative enclosure cover 11 that is a solid enclosure cover 42. The solid enclosure cover 11 may have a generally solid frame 58. The solid frame 58 is free of a screen opening. FIG. 11 is a front view of an illustrative enclosure cover 11 that is a window-containing enclosure cover assembly 44. The window-containing enclosure cover assembly 44 includes a frame 48 having a screen opening 56. FIG. 12 is a front view of an illustrative enclosure cover 11 that is a window and speaker containing enclosure cover assembly 46. The enclosure cover 46 may include one or more speaker openings 70, one or more switches (e.g., power switches) 152, one or more sensors 160, or any combination thereof. The speaker openings 70 preferably are positioned on the forward wall 52 of the frame 48. The switch 152 preferably is positioned on the forward wall 52 of the frame 48. The sensor 160 preferably is positioned behind the screen opening 56 of the enclosure cover 46. For example, the sensor 160 may be attached to a clear plate in the region of the screen opening 56. for use with a display device and a speaker system (e.g., amplified speakers).

Figure 13:
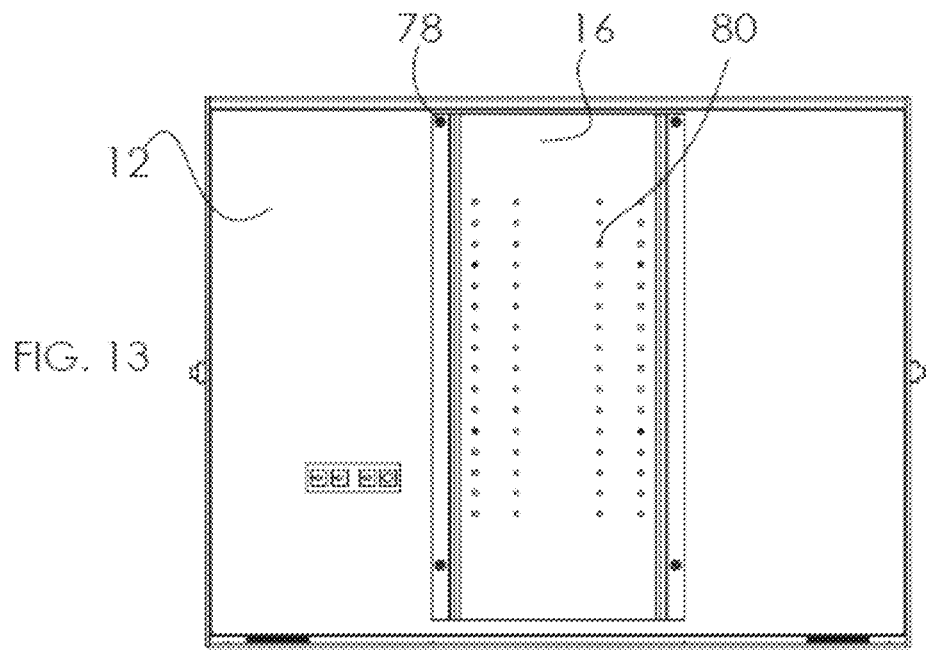
FIG. 13 is an illustrative front view of an enclosure base having n adapter component mounted to the base.

FIG. 13 is an illustrative front view of an enclosure base 12 having an adapter component 16 mounted inside. It will be appreciated according to the teachings herein that generally the adapter component will be attached to a display device 2 prior to attaching the adapter component to the enclosure base. However, FIG. 13 illustrates features of a preferred arrangement of the adapter component and the enclosure base. With reference to FIG. 13, the adapter component 16 may have a height that is nearly the height of the back wall 24 of the enclosure base 12 so that the top of the adapter component is in the region near the top wall 30 of the enclosure base and the bottom of the adapter component is in the region near the bottom wall 28 of the enclosure base 12. The adapter component preferably is relatively narrow compared with the width of the back wall 24 of the enclosure base 12.

Figure 14:
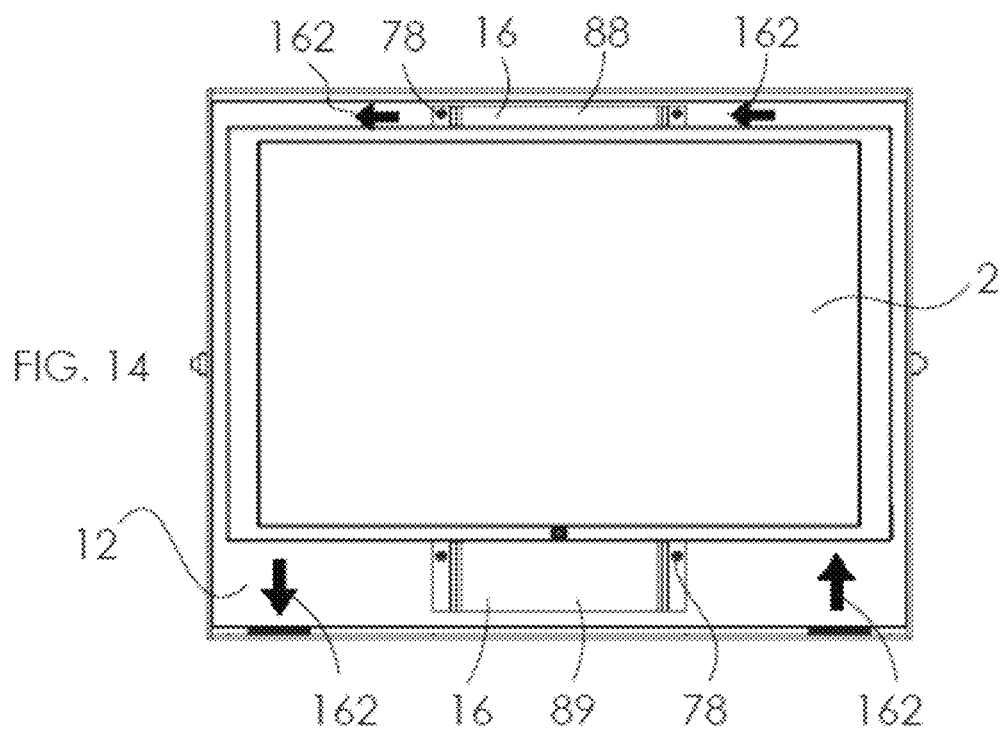
FIG. 14 is an illustrative drawing illustrating the front view f an enclosure base having a display device mounted to it via an adapter component.

FIG. 14 is an illustrative front view of an enclosure base 12 attached to an adapter component 16 which is attached to a display device 2. With reference to FIG. 14, a top portion 88 of the adapter component 16 preferably extends above the display device 2 so that one or more of the first openings 78 of the adapter component can be used for attaching the adapter component to the enclosure base 12 near the top wall 30. A bottom portion 89 of the adapter component 16 preferably extends below the display device 2 so that one or more of the first openings 78 of the adapter component can be used for attaching the adapter component to the enclosure base 12 near the bottom wall 28. The adapter component preferably creates a gap between the display device 2 and the back wall 24. The gap may permit air to circulate behind the display device 2. For example some or all of the air that enters a first ventilation opening may flow in a flow path 162 including one or any combination of the following: 1) flowing up and behind the display device generally near a first side (e.g., generally right side or generally left side), 2) flowing above the display device and or in front of the display device in a generally horizontal direction, or 3) flowing down and behind the display device in near a different side (e.g., a different generally right or left side), or 4).

Figure 15:
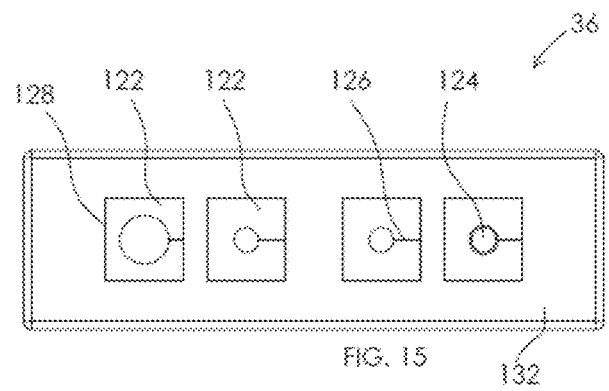
FIG. 15 is a front view of an illustrative cable pass-through component.
Figure 16:
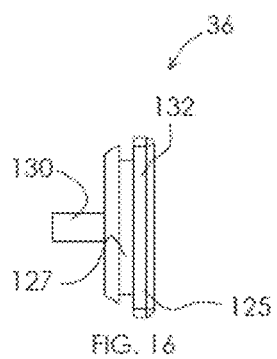
FIG. 16 is a side view of an illustrative cable pass-through component.
Figure 17:
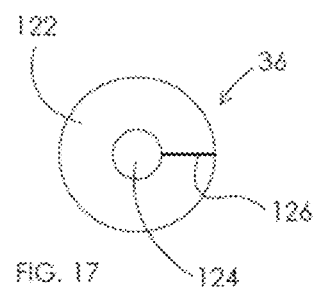
FIG. 17 is front view of the cable pass-through component shown in FIG. 16.

A front view of an illustrative cable pass through component 36 is shown in FIG. 15. The cable pass through component 36 may include one or more cable inserts 122. The cable insert 122 may have an opening 124 and preferably has a generally circular opening. The cable insert generally has an outer edge 125 with a slit 126 extending from the outer edge 125 to the opening 124. A portion of a cable can be slid through the slit 126 and inserted into the opening 124. As such, a cable can be inserted through an opening 124 without passing a cable end through the opening. The cable pass through component 36 may include cable inserts 122 having openings 124 with different sizes (e.g., different diameters), the same size (e.g., the same diameter), or both. The cable pass through component 36 may include a cable frame 132 that fits in a cable opening 35 in a wall of the enclosure device 10. The cable frame 132 may have one or more openings 128 for receiving cable inserts 122. With reference to FIG. 15, a cable frame 132 may include an opening for each cable insert 122. It will be appreciated that a single opening may be employed for two or more cable inserts 122. A cable insert may have a plurality of openings 122 each having a slit 126 going from the edge 125 to the opening 124 of the cable insert 122. The cable insert 122 may have a front surface having any shape. For example, the cable insert 122 may be polygonal (e.g., triangular or rectangular), circular, oval-shaped, elliptical-shaped, and the like. The opening 128 of the cable frame preferably has a corresponding shape so that the cable frame 132 forms a seal around the insert 122. The cable frame 132 may have an edge 125 with a groove or channel 127. When the cable pass-through component 36 is installed in a cable opening 35, a portion of the wall may fit into the groove or channel. As such, the cable pass-through component 36 may snap fit into the cable opening 35. It will be appreciated that the cable frame 132 and the cable insert 122 may be integrated into a single component such as illustrated in FIGS. 16 and 17. FIG. 16 is a front view of an illustrative cable pass-through component 36' that consists essentially of an insert 122 having an opening 124 and a slit 126 that extends from the opening 124 to an outer edge of the insert 122. FIG. 17 is a side view of the cable pass-through component 36 of FIG. 17. As shown in FIG. 17, the insert may be a frame 132 having an edge 125 including a groove and/or channel 127. As such, the insert 122 may be attached directly to a cable opening 35. With reference to FIG. 16, an insert 122 opening 124 may be sealed with a plug 130 (e.g., for preventing water entering the cavity 15 of the enclosure device through the opening 15.

Figure 18:
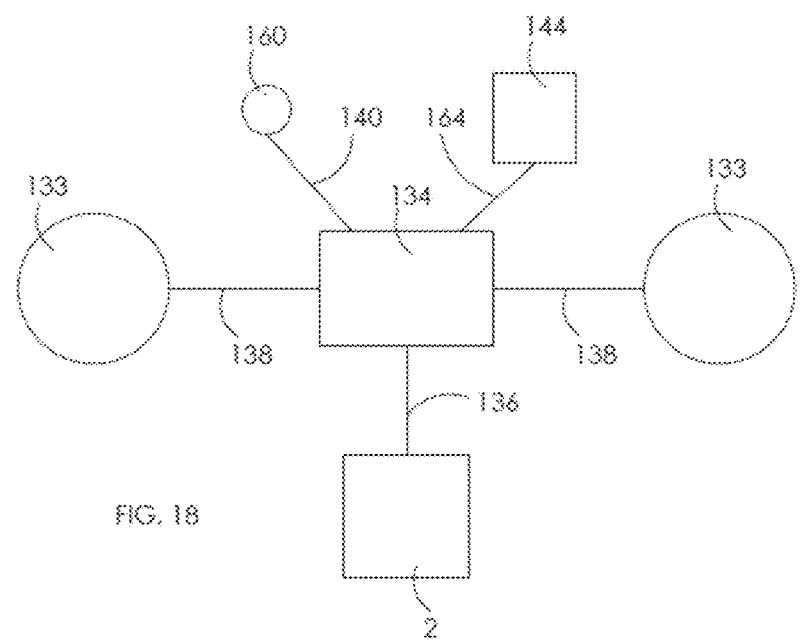
FIG. 18 is a schematic drawing illustrating electronic devices that may be employed in an enclosure device according to the teachings herein.

According to the teachings herein, the enclosure device 10, may be employed with one or more electronic devices. The one or more electronic devices may include a video display system including one or any combination of the features illustrated in FIG. 18. The video display system includes a display device 2. The display device 2 may be in electrical communication with an amplifier 134, for example using one or more cables 136. The amplifier 134 may be in electrical communication with one or more speakers 133 using speaker cables 138. The system may employ an sensor 160 (e.g., for receiving a signal, such as an infrared signal or a radio frequency signal. The device may include a cable 140 for electrical communication between the sensor 160 to another component, such as to the amplifier, to a controller, or to the display device. The device may include a power supply 144, such as a power supply 144 electrically connected to the amplifier 164.

Figure 19:
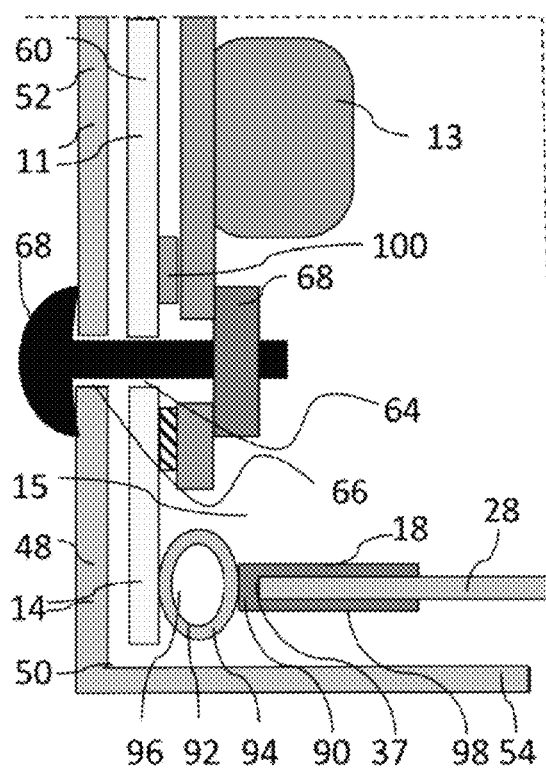
FIG. 19 is a cross-sectional view of an enclosure device illustrating the sealing of a cavity.

FIG. 19 is a cross-section view illustrating a component 13 fastened to a wall of the enclosure device. The component 13 may include an opening for receiving a fastener. The fastener may pass through an opening in the wall, an opening in the component 13, and an opening in a gasket. The gasket may be employed for creating a seal so that water entering the cavity is reducing or preventing. With reference to FIG. 19, the component 13 may be mounted on a front wall 52 of the enclosure cover 11. The fastener may pass through an opening in the frame 48, an opening in the clear plate 60, an opening in a gasket 100, and an opening in the component 13. The gasket preferably seals the opening of the clear plate 60. It will be appreciated that the clear plate 60 and the frame 48 may be sealed or may not be sealed. For example, with reference to FIG. 19, there may be one or more regions where water can flow between the clear plate 60 and the frame 48. As such water may flow along the outside wall of the clear plate 60 and then along the bottom wall of the enclosure cover. With reference to FIG. 19, the sealing component 18 may create a seal between the enclosure base 12 (shown by the bottom wall 28 of the enclosure base) and the clear plate 60. The sealing component 18 may include a connecting portion 90 for connecting to a wall 28. The connecting portion 90 may have a channel 90 for connecting with a wall 28. The sealing component 18 may include a sealing portion 92 for forming a seal. The sealing portion 92 may have a bulb 94 including an opening 96. The sealing portion 92 preferably is deformable so that a seal (e.g., a water tight seal) can be formed with the cover 11.

Figure 20:
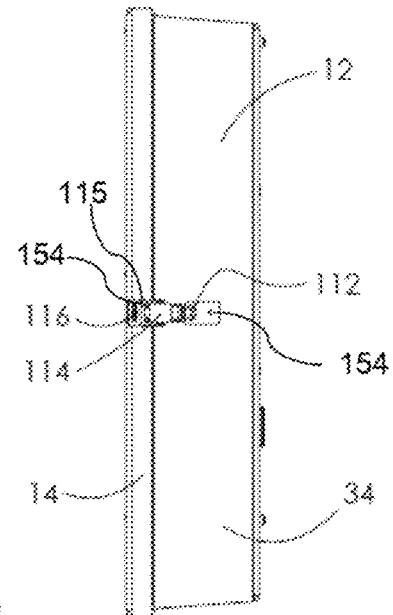
FIG. 20 is a side view of an illustrative enclosure base.

FIG. 20 is a side view drawing of an illustrative enclosure device including a latch 116 (e.g., a lockable latch) having a first portion 112 attached to a wall of an enclosure base 12 and a second portion 114 attached to a wall of enclosure cover assembly 14. When the first and second portions of the latch are engaged, the latch preferably provides a force that compresses a sealing component between the enclosure base 12 and enclosure cover assembly 14 for creating a seal.

Figure 21:
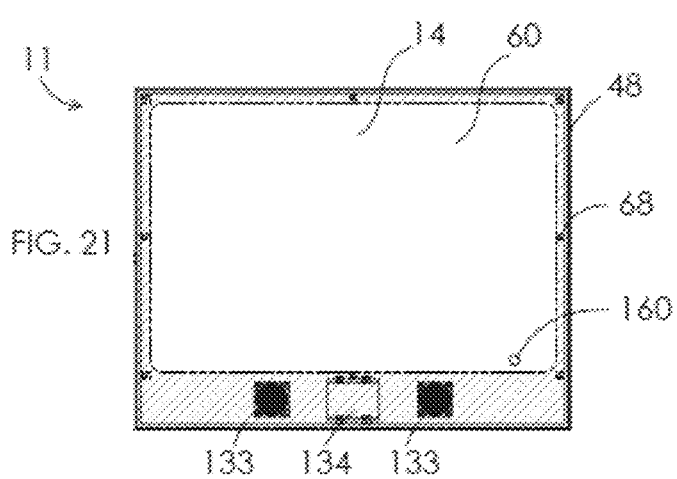
FIG. 21 is a rear view of an illustrative enclosure cover assembly.

FIG. 21 is a rear view drawing of an illustrative enclosure cover assembly 14. One or more electronic components (e.g., one or more speakers 133, an amplifier 134, a sensor 160, or any combination thereof) are preferably attached to the enclosure cover assembly. For example, an amplified speaker system including an amplifier and one or more speakers may be attached to the enclosure cover assembly 14. The enclosure cover assembly 14 may have a clear plate 60 that is attached to a frame 48 using a plurality of fasteners 68. The fasteners are preferably tamper resistant fasteners, according to the teachings herein. The enclosure cover assembly 14 and the clear 60 plate may be attached using a fastener system that prevents water from entering the cavity of the enclosure device (e.g., using a gasket, seal, or caulk). With reference to FIG. 21, the clear plate 60 may cover substantially the entirety of the inside of the frame 48 (e.g., between the walls of the frame). One or more electronic components 133, 134, 160 may be attached to the enclosure cover assembly with tamper resistant fastener(s) (e.g., a fastener that cannot be removed when the enclosure device is closed. One or more electronic components 133, 134, 160 may be attached to the enclosure cover assembly using a fastening system or adhesive system that prevents water entering the cavity of the enclosure device. A component (e.g., an electronic component) attached to the enclosure cover assembly may be attached using an opening through the frame 48, or an opening through the clear plate 60, or corresponding openings through the frame 48 and the clear plate 60.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0,0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of the Invention of a range in terms of at "x parts by weight of the resulting polymeric blend composition" also contemplates a teaching of ranges of same recited amount of "x in percent by weight of the resulting polymeric blend composition."

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consists of, the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not. It is understood that the above description is intended to be illustrative and not restrictive. Many embodiments as well as many applications besides the examples provided will be apparent to those of skill in the art upon reading the above description.

The explanations and illustrations presented herein are intended to acquaint others skilled in the art with the invention, its principles, and its practical application. Those skilled in the art may adapt and apply the teachings in their numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

LISTING OF DRAWING REFERENCE NUMBERS

Number/Feature Description
2 Display device
4 Mount r Universal mount
10 Enclosure device
11 Enclosure cover
12 Enclosure base
13 Component attached to a wall of the enclosure device
14 Enclosure cover assembly
15 Cavity
16 Adapter component
17 Adapter plate
18 Sealing component
20 Attachment component for attaching enclosure base and enclosure cover
22 Vertical tray
24 Back wall of enclosure base
26 Edges of back wall of enclosure base
28 Bottom wall of enclosure base
29 β, Slope of bottom wall of enclosure base
30 Top wall of enclosure base
31 α, Slope of top wall or enclosure base
32 Left wall of enclosure base
34 Right wall of enclosure base
35 Cable opening for cable pass through component
36 Cable pass through component
37 Forward periphery edges of the side walls of enclosure base
38 First holes of enclosure base (preferably on back wall)
39 Ventilation opening(s)
40 Second holes of enclosure base (preferably on back wall)
42 Solid enclosure cover
44 Window-containing enclosure cover assembly
46 Enclosure cover assembly—version with window and speakers holes
48 Frame
50 Internal flange
52 Forward Wall
54 Side walls of enclosure cover and/or enclosure frame
56 Screen Opening of Frame
58 Solid Frame with no screen opening
60 Clear Plate
62 Clear Plate Attachment Component (for attaching the clear plate to the frame)
64 Holes or other openings in clear plate (for attaching to frame)
66 Holes or other openings in frame (for attaching clear plate)
68 Fastener (e.g., Pins, screws, bolts) for attaching clear plate and frame
70 Opening for a speaker
72 Rear plate portion(s) of adapter component
74 Front plate portion(s) of adapter component
76 Connection portion(s) of adapter component (connect a front and rear portion)
78 First openings of adapter component
80 Second openings of adapter component
82 First plane
84 Second plane
N Distance between the first plane and the second plane
88 Top region of adapter component (e.g., above the display device)
89 Bottom region of adapter component (e.g., below the display device)
90 Connecting portion of sealing component (preferably a relatively hard material)
92 Sealing portion (preferably a relatively soft material)
94 Bulb
96 Opening in the bulb
98 Channel of connecting portion
100 Gasket or seal for a fastener
112 First portion of securing component
113 Opening(s) in the enclosure base for attaching a securing component
114 Second portion of securing component 115 Opening(s) in the enclosure cover for attaching a securing component
116 Latch (preferably a lockable latch)
118 Cable pass through component
122 Cable insert
124 Opening/hole of cable insert
125 Outer edge of cable frame
126 Slit of the cable insert
127 Groove and/or channel in outer edge of cable frame
128 Opening(s) of frame (for receiving insert)
130 Plug (for plugging a hole in an unused insert)
132 Cable frame
133 Speaker
134 Amplifier
136 Cable for connecting amplifier to the display device
138 Cable for connecting to speaker
140 Cable for connecting to infrared signal reader
144 Power supply for amplifier
146 Drain holes
150 Horizontal
152 Power Switch
154 Tamper resistant fastener system
160 Sensor (i.e., signal receiver), preferably for infrared or RF signal
162 Air flow path
164 Cable to amplifier (e.g., power cable)

What is claimed is:

1. An enclosure device for enclosing a display comprising:
   i) an enclosure base, wherein the enclosure base is a vertical tray including a generally vertical back wall having four or more edges and a plurality of side walls wherein each side wall extends from one of the edges of the back wall, wherein each side wall has a forward periphery edge, wherein the plurality of side walls includes a bottom wall, a top wall, a right side wall, and a left side wall, and wherein the back wall has a first set of holes and a second set of holes;
   ii) an adapter component having a plurality of first openings for attaching the adapter component to the first set of holes of the back wall, and a plurality of second openings for attaching the adapter component to a display device, wherein the first set of openings are not coplanar with the second set of openings, wherein the adapter component is a single plate, wherein the adapter plate includes two rear plate portions connected to a front plate portion by connector portions wherein the two rear plate portions extend outward from the connector portion in opposing direction away from the front plate portion, wherein the first openings of the adapter plate are positioned on an extending portion of the adapter plate such that, after the display is attached to the adapter plate and inserted into the enclosure base so that the adapter plate can then be attached to the back wall, said extending portion of the adapter plate extends past the periphery of the display device such that the first openings are accessible around the periphery of the display by way of a substantially straight path from the exterior of the enclosure through a front opening of the enclosure;
   iii) a sealing component including a connecting portion and a sealing portion, wherein the connecting portion includes a connection feature for attaching to one or more of the side walls so that the sealing portion at least partially extends forward of the forward periphery edge of the side walls;
   iv) an enclosure cover having an internal flange wherein the enclosure cover is sufficiently large for covering the entirety of the forward periphery edge of the enclosure base; and
   v) one or more securing components for attaching the enclosure cover assembly to the enclosure base, wherein the securing component creates a compressive force between the enclosure cover assembly and the enclosure base so that the sealing component seals the forward periphery edge of the enclosure base and the enclosure cover assembly, and wherein a cavity is formed for a display mounted on the adapter component; wherein one or more of the walls includes a cable pass-through component for allowing the connection of a cable from the display in the cavity to a component outside of the cavity without creating an entrance for water, insects, or other contaminants.

2. The enclosure device of claim 1, wherein the enclosure cover is an enclosure cover assembly including a frame having the internal flange and a clear plate positioned within the internal flange of the frame, and wherein the sealing portion seals the clear plate and the forward periphery edge of the enclosure base.

3. The enclosure device of claim 2, wherein the clear plate is attached to the frame.

4. The enclosure device of claim 3, wherein the clear plate has a forward surface having an outer periphery, wherein the enclosure cover assembly does not include a sealing component for sealing the outer periphery of the clear plate to the frame.

5. The enclosure device of claim 2, wherein the enclosure device includes a single seal between the enclosure base and the enclosure cover.

6. The device of claim 1, wherein the device, when assembled and attached to a universal mount, is generally free of any openings in the top wall, the back wall, and the side walls that would allow water, insects, or other impurities from entering the cavity.

7. The device of claim 1, wherein the plurality of second openings of the adapter plate is about 8 or more so that the adapter plate can be used with displays having different arrangements of screw holes.

8. The device of claim 1, wherein the number of first holes and second holes of the back wall is equal to the number of holes required for attaching the back wall to the adapter and to a universal mount.

9. The device of claim 1, wherein the display can be viewed only by removing the enclosure cover.

10. The device of claim 1, wherein the device includes one or more vents positioned on the bottom wall of the enclosure base.

11. The device of claim 1, wherein the sealing component includes a bulb seal.

12. The device of claim 1, wherein one or more securing features includes a lockable latch.

13. The device of claim 1, wherein the device includes one or more speakers.

14. The device of claim 13, wherein the device includes an amplifier connected to the one or more speakers.

15. The device of claim 1, wherein the enclosure base and/or the enclosure cover includes one or more features for passively removing heat generated by the display.

16. The device of claim 1, wherein the cable pass through component includes one or more cable inserts having a front surface, a back surface, and an edge surface, wherein the cable insert includes an opening for encircling a portion of a cable of a cable component having terminated ends, and a slit extending from the edge surface to the opening of the cable insert for inserting a portion of the cable into the opening.

17. The device of claim 1, wherein the cable pass through component includes a plurality of cable inserts including a first cable insert and a second cable insert, wherein the opening of the first and second cable inserts have different sizes for sealing against cables of different dimensions.

18. The enclosure device of claim 1, wherein
the enclosure cover is an enclosure cover assembly including a frame having the internal flange and a clear plate positioned within the internal flange of the frame;
the sealing portion seals the clear plate and the forward periphery edge of the enclosure base;
the clear plate is attached to the frame;
the clear plate has a forward surface having an outer periphery, wherein the enclosure cover assembly does not include a sealing component for sealing the outer periphery of the clear plate to the frame;
the plurality of second openings of the adapter plate includes 8 or more openings so that the adapter plate can be used with displays having different arrangements of screw holes;
the device includes one or more vents positioned on the bottom wall of the enclosure base;
the sealing component includes a bulb seal;
the one or more securing features includes a lockable latch; and
the device includes one or more speakers and an amplifier connected to the one or more speakers.

19. The device of claim 1, wherein the adapter component is mounted inside the cavity.

20. The device of claim 19, wherein the adapter component creates a gap between the display and the back wall of the enclosure base.

21. The device of claim 20 wherein the adapter component has a height that is nearly a height of the back wall of the enclosure base so that a top portion of the adapter component extends above the display and a bottom portion of the adapter component extends below the display.

22. The device of claim 21, wherein the adapter component is mounted to the enclosure base using a tamper resistant fastener.

23. The device of claim 1, wherein the adapter plate is a singular monolithic piece.

24. An enclosure device for enclosing a display comprising:
i) an enclosure base,
ii) an adapter plate for attaching to the enclosure base, wherein the adapter plate has a plurality of first openings for attaching the adapter component to the first set of holes of the enclosure base, and a plurality of second openings for attaching the adapter component to a display device, wherein the first set of openings are not coplanar with the second set of openings wherein the adapter component is a single plate, wherein the adapter plate includes two rear plate portions, connected to a front plate portion by connector portions, wherein the two rear plate portions extend outward from the connector portion in opposing direction away from the front plate portion, wherein the first openings of the adapter plate are positioned on an extending portion of the adapter plate such that, after the display is attached to the adapter plate and inserted into the enclosure base so that the adapter plate can then be attached to the enclosure base, said extending portion of the adapter plate extends past the periphery of the display device,
iii) an enclosure cover for covering the enclosure base and forming a cavity for a display device, wherein the enclosure cover includes a cover frame having one or more speaker openings, wherein the cover frame has a rear surface facing towards the cavity, wherein said extension of said extending portion of the adapter plate past the periphery of the display device is such that, when enclosure is open such that the cover is not substantially covering the enclosure base thereby creating a front opening, the first openings are accessible around the periphery of the display by way of a substantially straight path through the front opening from the exterior of the enclosure;
iv) a sealing component for forming a seal between the enclosure base and the enclosure cover;
v) one or more speakers attached to the rear surface of the cover frame; and
vi) an amplifying system attached to at least one of the one or more speakers; wherein the amplifying system includes an amplifier for receiving an input signal, increasing the amplitude of the signal, and producing an output signal and one or any combination of the following: a) an infrared signal reading component for receiving infrared signals; b) an amplifier power supply; c) one or more connectors for connecting an audio source and the amplifier; d) one or more connectors for connecting the infrared signal reading component and the amplifier; or e) one or more connectors between the amplifier for a speaker external to the enclosure device.

25. A process for mounting a display device to an enclosure device having a moveable enclosure cover comprising:
a step of attaching the display device to an adapter plate, wherein the adapter plate is a single plate;
a step of attaching the adapter plate, with the display device attached, to an enclosure base, wherein the adapter plate has a plurality of first openings for attaching the adapter component to the first set of holes of the enclosure base, and a plurality of second openings for attaching the adapter component to a display device wherein the first set of openings are not coplanar with the second set of openings, wherein the adapter plate includes two rear plate portions, connected to a front plate portion by connector portions, wherein the two rear plate portions extend outward from the connector portion in opposing direction away from the front plate portion, wherein the first openings of the adapter plate are positioned on an extending portion of the adapter plate such that, after the display is attached to the adapter plate and inserted into the enclosure base so that the adapter plate can then be attached to the back wall, said extending portion of the adapter plate extends past the periphery of the display device, wherein said extension of said extending portion of the adapter plate past the periphery of the display device is such that, when enclosure is open such that the cover is not substantially covering the enclosure base thereby creating a front opening, the first openings are accessible around the periphery of the display by way of a substantially straight path through the front opening from the exterior of the enclosure; and
a step of covering the enclosure base with the enclosure cover so that the display device is in a sealed cavity of the enclosure device and the front opening is closed.

* * * * *